(12) United States Patent
Doering et al.

(10) Patent No.: US 7,015,426 B2
(45) Date of Patent: Mar. 21, 2006

(54) PURGED HEATER-SUSCEPTOR FOR AN ALD/CVD REACTOR

(75) Inventors: Ken Doering, San Jose, CA (US); Mike Kubani, San Jose, CA (US); Gi Kim, San Jose, CA (US); David Foote, San Jose, CA (US)

(73) Assignee: Genus, Inc., Sunnyvale, CA (US)

( * ) Notice: Subject to any disclaimer, the term of this patent is extended or adjusted under 35 U.S.C. 154(b) by 2 days.

(21) Appl. No.: 10/777,349

(22) Filed: Feb. 11, 2004

(65) Prior Publication Data

US 2004/0211764 A1    Oct. 28, 2004

Related U.S. Application Data

(60) Provisional application No. 60/446,892, filed on Feb. 11, 2003.

(51) Int. Cl.
*F27B 5/14*    (2006.01)

(52) U.S. Cl. .............. 219/390; 219/405; 219/411; 392/416; 392/418; 118/724; 118/725; 118/50.1

(58) Field of Classification Search ........... 219/390, 219/405, 411; 392/416, 418; 118/724, 725, 118/50.1
See application file for complete search history.

(56) References Cited

U.S. PATENT DOCUMENTS

| 5,800,686 A | 9/1998 | Littau et al. |
| 6,066,836 A | 5/2000 | Chen et al. |
| 6,189,482 B1 * | 2/2001 | Zhao et al. ............. 118/723 R |

FOREIGN PATENT DOCUMENTS

| EP | 0 592 017 A2 | 4/1994 |
| EP | 0 855 735 A2 | 7/1998 |

OTHER PUBLICATIONS

"International Search Report", International Searching Authority, PCT/ US2004/ 004556, (Jul. 13, 2004).

* cited by examiner

*Primary Examiner*—Shawntina Fuqua
(74) *Attorney, Agent, or Firm*—Sonnenschein Nath & Rosenthal LLP (57) ABSTRACT

A heater assembly for an ALD or CVD reactor provides protection for an electrical conductor associated with a heating element by using a purge gas to isolate the conductor from the corrosive environment of the reactor chamber. The purge gas is introduced into a sleeve surrounding the conductor and from there is allowed to leak into the reactor chamber to be pumped out with the process gasses. This arrangement avoids the need for airtight seals at the junction of the sleeve and the heating element easing manufacturing requirements and potentially reducing component costs.

29 Claims, 4 Drawing Sheets

PURGED HEATER-SUSCEPTOR FOR AN ALD/CVD REACTOR

RELATED APPLICATIONS

This application is related to and claims the priority benefit of U.S. Provisional Application No. 60/446,892, titled "Purged ALN Heater Susceptor" filed Feb. 11, 2003 incorporated herein by reference.

FIELD OF INVENTION

The present invention relates generally to the field of chemical vapor deposition and atomic layer deposition reactors and, more specifically, the heating apparatus for such reactors.

BACKGROUND OF THE INVENTION

The modern electronics we rely on today are comprised of many complex components. One such component is the microelectronic chip made up of thousands or millions of tiny transistors. These transistors are currently manufactured on semiconductor wafers by a process known as lithography. However, prior to the lithography process, the semiconductor wafer must be manufactured from a standard silicon wafer. In order to produce a semiconductor wafer, the silicon wafer must undergo a process of applying one or more layers of varying materials, usually metals, onto its surface. Two examples of such processes are CVD (Chemical Vapor Deposition) and ALD (Atomic Layer Deposition).

CVD is a process wherein a thin film of material is layered or deposited on varying materials, including semiconductors, insulators, and metals. The deposited film or films are formed as a result of chemical reactions between gaseous reactants at elevated temperatures within a reactor chamber.

ALD is another process for creating films on a surface within a heated reactor chamber. In this process, the deposition of each atomic layer of material is controlled by a pre-deposited layer of precursor. Precursors of various components are introduced alternately to produce the film on the targeted surface. As with CVD, ALD also relies on chemical agents and elevated temperatures within the reactor chamber.

In either process, the reactor chamber is a very harsh environment for its internal structures. The process chemicals are very toxic and very corrosive, tending to eat away any structure within the chamber. In addition to the harsh chemical environment, the temperatures can range from room temperature to 600 degrees Celsius (1,112 degrees Fahrenheit). This dramatic change in temperature creates expansion and contraction forces between components within the chamber as well as breaking down any non-metallic components, such as rubber or plastic gaskets and washers.

In order to produce the heat required for these processes, the reactor chamber requires heating to ensure a uniform temperature on the reactive surface. However, in order to provide power to the heating element and to monitor the temperature, an electrical connector and a thermocouple must also be routed into the harsh environment of the chamber. Because of the excessive heat and the corrosive and reactive nature of the chemicals within the chamber, the power connector and the thermocouple tend to deteriorate and fail over time. These failures result in reactor down time, damaged product and, in some cases, damage to other elements of the reactor.

One solution, as presented in U.S. Pat. No. 6,066,836 of Chen et al., is to feed the electrical connector and thermocouple through the inner portion of a completely sealed support shaft within the chamber. Because the electrical connector and thermocouple are sealed from the reactor and its chemical contents, the problems associated with heat and chemicals is minimized. However, this arrangement is costly to produce and costly to maintain. The upper portion of the shaft closest to the heater has to be sealed with expensive high temperature hermetic seals. Further complicating the design, in order to maintain the airtight seal, the shaft must be mounted on a flexible coupling in order to account for the thermal expansion during the process. Additionally, the high temperature seals do eventually fail in the harsh environment of the reactor chamber and the machine must be shut down and undergo repairs, each of which are very costly to the operator.

SUMMARY OF THE INVENTION

A purged heater assembly for an ALD or CVD reactor is configured to prevent process agents from damaging conductors within the reactor chamber, such as electrical power conductors and temperature sensors for a reactor heater plate.

In one embodiment of the present invention, the purged heater assembly is located within a wafer processing reactor chamber and includes an electrical conductor disposed within a hollow interior of a sleeve and connected to an electrically operated heating platform. A base plate assembly is adapted to support the sleeve within the chamber so as to provide a non-airtight junction at a second end of the sleeve where it contacts the electrically operated heating platform. In another embodiment, an atmospheric support shaft may be coupled to the base plate assembly so as to support the heater assembly within the wafer processing chamber and to provide cooling lines to the base plate assembly and to provide a path to conduct heat away from the base plate assembly.

In one embodiment of the present invention, the electrically operated heating platform includes a heater plate that is adapted to support a wafer. Among varying embodiments, the electrically operated heating platform may include a resistive heating element and may be embedded into the surface of the heater plate or may be itself the heater plate.

In one embodiment of the present invention, the sleeve may be ceramic, such as aluminum oxide or aluminum nitride. In another embodiment, the base plate assembly may be metallic and the conductor may be coiled within the interior of the sleeve. In other embodiments, the base plate assembly may also include a coolant manifold for coolant flow through the base plate assembly and may include at least one purge gas manifold within the base plate assembly to provide a fluid path to the hollow interior of the sleeve. In another embodiment, a source fitting may be coupled to the sleeve and adapted to allow fluid to pass into the hollow interior of the sleeve. In yet another embodiment, a return fitting may be coupled to the sleeve and adapted to allow fluid to pass out of the hollow interior of the sleeve.

In one embodiment of the present invention, at least one orifice may be located at the non-airtight junction at the first end of the sleeve adapted to permit a purge gas to leak from the hollow interior of the sleeve into the wafer processing chamber.

In one embodiment of the present invention, the heater assembly may have an elastomeric gasket countersunk within the base plate assembly adapted to provide a seal at a second end of the sleeve. The elastomeric gasket may also provide a spring force at the second end of the sleeve to maintain contact of the first end of the sleeve with the electrically operated heating platform. In another embodiment, the seal may be an airtight seal.

In one embodiment of the present invention, the heater assembly includes a stabilizer countersunk flush with an upper surface of the lower base plate creating a mating surface with the insulator which is countersunk flush with the lower surface of the upper base plate. The stabilizer may be adapted to support the electrical conductor and to cooperate with a conductor seal surrounding the electrical conductor. The conductor seal is located at the mating surface to prevent fluid from the purge gas manifold from leaking along a portion of the electrical conductor, which passes through the insulator and the stabilizer.

In one embodiment of the present invention, a heater assembly for a wafer processing chamber includes an electrically operated heating platform supported by a pedestal having a hollow interior and a sleeve disposed within the hollow interior of the pedestal and itself having a hollow interior. An electrical conductor disposed within the hollow interior of the sleeve is connected to the electrically operated heating element. A base plate assembly adapted to support the sleeve within the hollow interior of the pedestal includes a manifold for a purge gas to be provided to the hollow interior of the sleeve during wafer processing operations.

In one embodiment of the present invention, the base plate assembly may be coupled to the pedestal and adapted to provide a seal at a first end of the sleeve and at a first end of the pedestal where each contacts the base plate assembly. In various embodiments, at least one of the seals at the first end of the pedestal and at the sleeve may be an airtight seal.

In one embodiment of the present invention, at least one orifice may be located at a non-airtight junction at the second end of the sleeve adapted to permit the purge gas to leak from the hollow interior of the sleeve into the hollow interior of the pedestal. In another embodiment, a second orifice may be located at a non-airtight junction at a second end of the pedestal adapted to permit the purge gas to leak from the hollow interior of the pedestal into the wafer processing chamber where it may be pumped out with the process gases.

In one embodiment of the present invention, a method to prevent process agents from damaging conductors, such as electrical and thermocouple connectors for a reactor heater plate within an ALD or CVD reactor chamber includes, delivering a purge gas within a sleeve surrounding an electrical conductor associated with an electrically operated heating assembly of a wafer processing chamber so that the purge gas envelopes the electrical conductor within the sleeve and escapes from an unsealed end thereof into the processing chamber to be pumped out with process gases.

BRIEF DESCRIPTION OF THE DRAWINGS

The present invention is illustrated by way of example, and not limitation, in the figures of the accompanying drawings, which illustrate various embodiments of the present invention.

DETAILED DESCRIPTION

The present invention provides a purged heater assembly for an ALD/CVD reactor. In one embodiment, a conductor, including an electrical connector powering a heating element, is isolated from the reactor chamber within a sleeve that is disposed within a pedestal that supports the heating element. An inert purge gas is introduced within the sleeve so as to isolate the connector from the harsh environment within the reactor chamber. The purge gas is allowed to pass from the sleeve into the chamber and be evacuated therefrom with the process gases. Owing to this arrangement, the requirement to completely seal the conductor at the backside of the heater utilizing a flexible coupling and high temperature hermetic seals is obviated. Additionally, because the inert purge gas is maintained at a positive pressure with respect to the area surrounding the sleeve, the reactive chemicals within the chamber do not come in contact with the conductor or any other internal structures within the sleeve.

Figure 1:
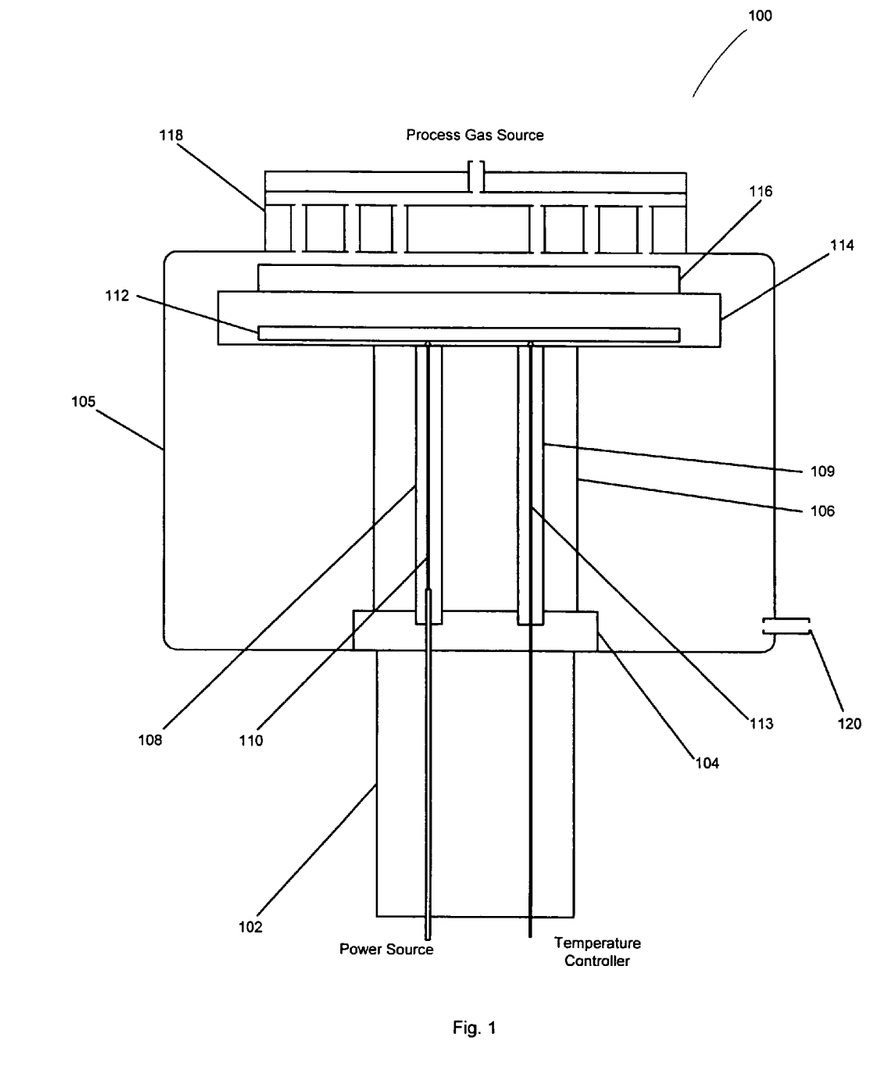
FIG. 1 illustrates a reactor having a purged heater-susceptor configured for CVD and ALD processes, according to an embodiment of the present invention.

FIG. 1 illustrates a reactor 100 having a purged heater-susceptor assembly configured for CVD and/or ALD processes, according to an embodiment of the present invention. The reactor 100 has a showerhead 118 configured to deliver process gases to wafer 116 within chamber 105 through multiple nozzles. The process gas flows over and around wafer 116 and is contained within chamber 105, until eventually it is pumped out through exit 120. Upon exposure to the process gas and high temperature, a chemical reaction occurs, wherein the wafer 116 develops a film of material upon its top surface.

In order to achieve the temperatures required for these chemical reactions, the chamber 105 also contains a heater plate 114 including a heater element 112. The wafer 116 rests upon the heater plate 114 providing a surface for heat transfer from the heater plate 114 to the top surface of wafer 116. The heating element 112 is connected to a power source through conductor 110. In order to monitor the temperature of the heating plate 114, a temperature sensor 113 is coupled to the heater plate 114 and in communication with a remote temperature controller.

Pedestal 106 supports the heater plate 114 and encloses and protects sleeves 108 and 109 from the harsh process chemicals of chamber 105. Sleeves 108 and 109 further enclose and protect the heating element conductor 110 and the temperature sensor 113, respectively. The heating element conductor 110 and the temperature sensor 113, therefore, are separated from chamber 105 and process gases by pedestal 106 and sleeves 108 and 109, respectively.

The pedestal 106, sleeve 108 and sleeve 109 each are supported by base plate assembly 104. The base plate assembly 104 provides a sealed passage into an atmospheric support tube 102 for the heating element conductor 110 and the temperature sensor 113. The atmospheric support tube 102 may further include cooling ducts therein to carry heat away from the base plate assembly 104. In another embodiment, the atmospheric support tube 102 may also include passageways, such as metal or rubber tubing, to carry coolant into and out of the base plate assembly 104.

Figure 2:
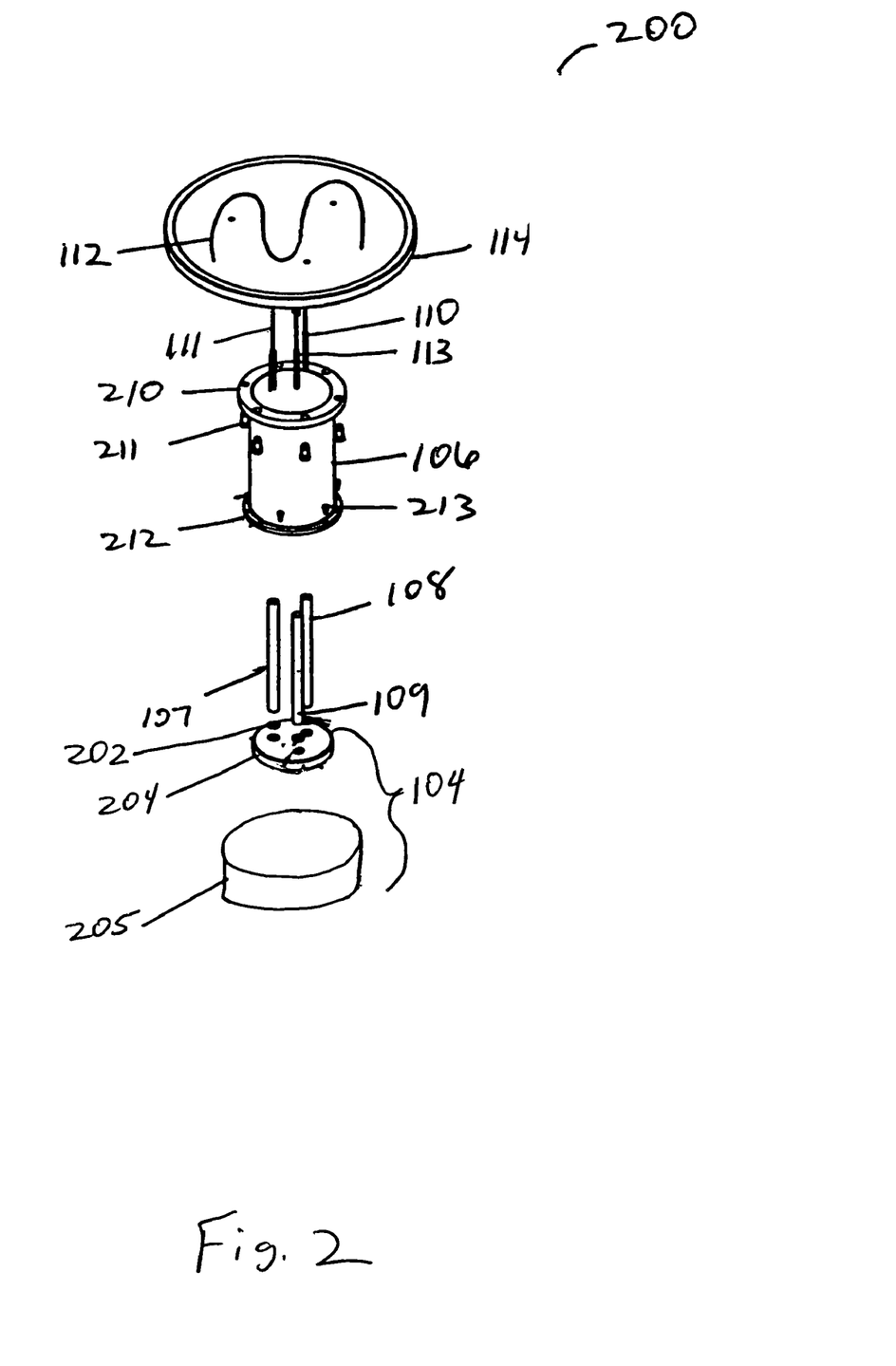
FIG. 2 illustrates a portion of a heater-susceptor assembly for channeling a purge gas through a sleeve within which an electrical conductor or other element is disposed, according to an embodiment of the present invention.

FIG. 2 illustrates an exploded view of a heater assembly 200 configured according to an embodiment of the present invention. The upper portion of heater assembly 200 includes heater plate 114. The upper surface of heater plate 114 provides a flat resting surface for the target of the deposition process, i.e., a semiconductor wafer. The top surface of such a wafer may then be exposed to the introduction of process fluids via a showerhead as discussed above.

Heater element 112 may be a resistive heating element disposed within heater plate 114. Heater element 112 is electrically connected to heating element conductors 110 and 111, which are disposed within sleeves 108 and 107, respectively. When current flows with this arrangement, heating element 112 becomes hot and transfers heat to the heater plate 114. The temperature sensor 113 is disposed within sleeve 109 and provides a signal path for a temperature reading of the heater plate 114. In varying embodiments, the sleeves, such as sleeves 107, 108 and 109, may be used for any type of connector or internal structure that needs to be introduced into the reactor chamber while remaining protected from the harsh chemical environment therein.

In one embodiment, the heater plate 114 is made of aluminum nitride. In varying embodiments, the heater element 112 may be embedded within or on the surface of heater plate 114. In another embodiment, the heater plate 114 is the heater element 112.

Pedestal 106 is the first layer of protection for heating element conductor 110, heating element conductor 111 and temperature sensor 113 from the highly corrosive and reactive process gases within the chamber. The pedestal 106, according to one embodiment of the present invention, is made from a good insulator, such as aluminum oxide or another ceramic material, so that the temperature transfer is minimized from the heater plate 114 down to the base plate assembly 104. In one embodiment of the present invention, the base plate assembly 104 may include two pieces, an upper base plate 204 and a lower base plate 205, each of which will be discussed in further detail below. In another embodiment, the pedestal 106 is made of aluminum oxide and has a thin coating of aluminum nitride so that it maintains the low temperature transfer characteristic of aluminum oxide but also has corrosion resistant properties of aluminum nitride.

The pedestal 106 is coupled to the heater plate 114 by an upper flange 210 and upper flange fasteners 211. To accommodate the heat from the heater plate 114, the upper flange fasteners 211 may be made of a corrosion resistant and/or insulating ceramic material, such as aluminum oxide or aluminum nitride. A lower flange 212 and fasteners 213 couple the lower end of pedestal 106 to the lower base plate 205. Because the lower end of the pedestal is cooler than the upper end, the lower flange fasteners 213 may be made of a metal, such as aluminum or nickel. In one embodiment, the upper flange fasteners 211 and the lower flange fasteners 213 have shoulders so that the upper flange 210 and lower flange 212 of pedestal 106 are held loosely against their mating surfaces, heater plate 114 and lower base plate 205, respectively. This arrangement prevents excessive stress due to thermal expansion mismatches during the ALD/CVD deposition process.

Enclosed within the pedestal 106 is the second layer of protection for heating element conductor 111, heating element conductor 110, and temperature sensor 113; sleeve 107, sleeve 108 and sleeve 109, respectively. The upper portions of sleeves 107, 108 and 109 abut against the bottom surface of heater plate 114 and will be discussed further below. The lower portion of sleeves 107, 108 and 109 are supported and sealed within upper base plate 204 in part by gaskets 202, which will be discussed in greater detail below.

In one embodiment of the present invention, the sleeves 107, 108 and 109 are made of a ceramic, such as aluminum oxide or another ceramic material, and the heating element conductors 110, and 111 may be made of any conducting material, such as nickel. Temperature sensor 113 may be a conventional thermocouple, though in other embodiments other forms of temperature sensors may be used. Additionally, a conductor, such as heating element conductor 110 may be coiled (at least partially) within a sleeve, such as sleeve 108, so that the conductor may accommodate a change in distance between the upper base plate 204 and the heater plate 114 as a result of thermal expansion during ALD/CVD processing.

Figure 3:
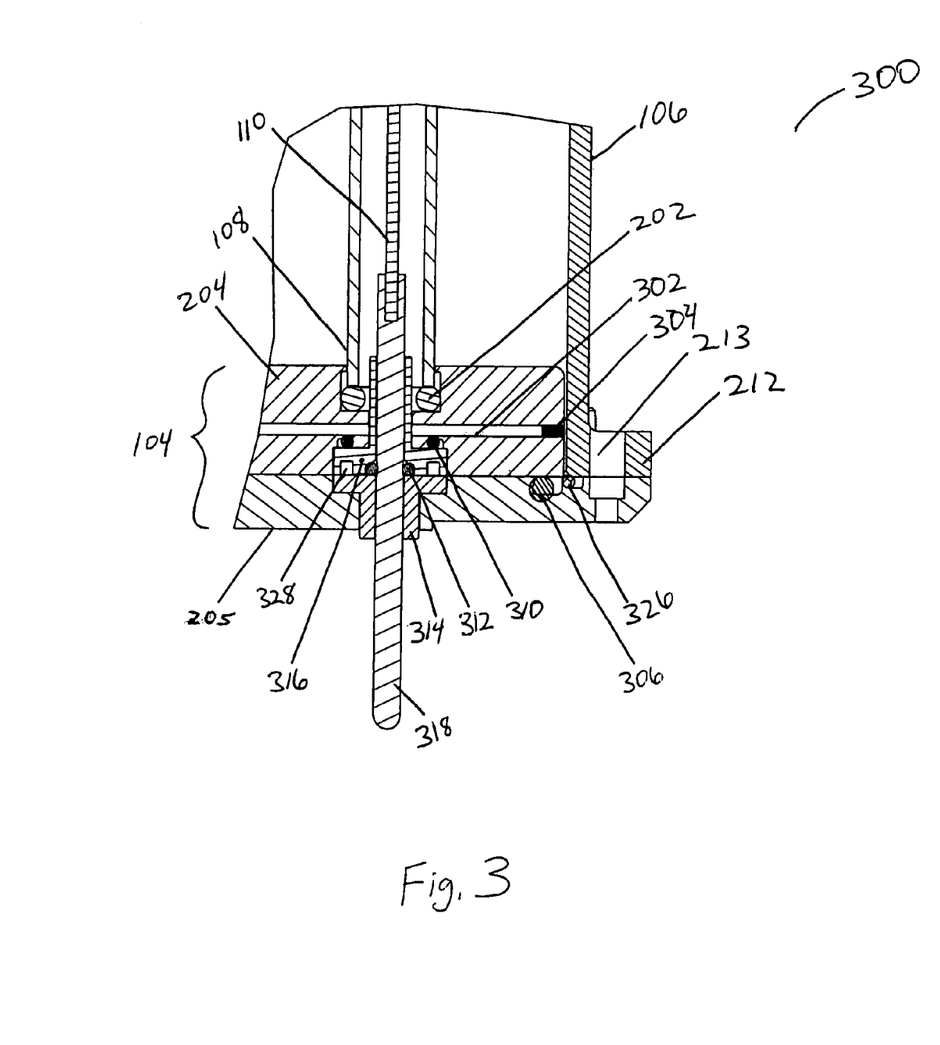
FIG. 3 illustrates a junction between a conductor-containing sleeves and a base plate assembly within a heater-susceptor assembly configured according to an embodiment of the present invention.

FIG. 3 illustrates a junction 300 between the sleeve 108, the pedestal 106, and the base plate assembly 104. This is an example of the type of junction that may be used at the interface between the sleeves and the base plate assembly, but other configurations of junctions may also be used. What is important is that the junctions provide means for delivering the purge gas from a source to the interior of the sleeve, so as to envelope the conductor or other element therein. In the present example, this means exists in the form of the manifold 302 for channeling a fluid (e.g., a purge gas) through the sleeve 108. and 10. The junctions between sleeves 107 and 109 may be similar to that of junction 300 and have been omitted for clarity.

In the illustrated example, base plate assembly 104 includes two pieces, a lower base plate 205 coupled to an upper base plate 204. In other arrangements the base plate assembly may have more or fewer components. Among varying embodiments, the upper base plate 204 and the lower base plate 205 may be made of the same material or of differing materials. For example, the upper base plate 204 may be made of one type of metal, such as aluminum, while the lower base plate 205 may be made of another type of metal, such as an aluminum alloy or titanium. In other embodiments, to prevent heat damage to the gaskets and seals, at least one of the upper base plate 204 and/or the lower base plate 205 may have a cooling manifold therein for circulating a coolant fluid to carry heat away from the base plate assembly 104 during the deposition process.

In one embodiment of the present invention, sandwiched between the lower base plate 205 and the upper base plate 204 is gasket 306. Gasket 306 prevents fluid from leaking between the mating surfaces of upper base plate 204 and lower base plate 205 at the outside circumference of upper base plate 204.

In one embodiment of the present invention, sandwiched between the upper base plate 204 and lower base plate 205, is an insulator 316 and its corresponding gasket, insulator seal 310. The insulator 316 prevents any conducting portion of heating element conductor 110 or conductor sheath 318 from shorting to the base plate assembly 104 and may be made of any material, such as a ceramic, that will prevent conductivity between the heating element conductor 110 (and/or conductor sheath 318) and the base plate assembly 104. Insulator seal 310 prevents fluid leaks between the upper base plate 204 and the upper portion of insulator 316. Stabilizer 314 may be set into the lower base plate 205, wherein its upper surface is mated to the lower surface of insulator 316 within upper base plate 204. A conductor seal 312 is sandwiched between the insulator 316 and the stabilizer 314 to prevent fluid leaks between the lower portions of insulator 316 and the upper portions of stabilizer 314 along the conductor sheath 318. In another embodiment, a portion of the heating element conductor 110 or the sheath 118 may not conduct electricity and the insulator 316 and/or stabilizer 314 may be made from a conducting material, such as aluminum. Insulator 316 may include a receptacle 328, such as a threaded hole, for coupling a device to the insulator 316 for its insertion/removal.

In one embodiment of the present invention, a fluid, such as an inert purge gas (e.g., argon) is fed into manifold 302 near the base of sleeve 108. The purge gas is allowed to pass into the hollow body of sleeve 108, surrounding the conductor or other element disposed therein, but is discouraged from leaking into the interior of pedestal 106 by the partial seal of gasket 202. Note that the seal provided by gasket 202 may or may not be an airtight seal. The purge gas then leaks out of the top portion of sleeve 108 and into the inner portion of the pedestal 106, as further discussed below. In various embodiments, the fluid within the manifold has a differential pressure in relation to the chamber of the reactor ranging from 5 to 150 torr. Among various other embodiments, the manifold may be of various shapes and sizes and includes at one plug 304 to prevent the fluid within manifold from leaking directly into the interior of pedestal 106.

In another embodiment, a fluid connector is connected directly to the lower portions of sleeve 108 and a purge gas is forced up the sleeve and into the inner portion of the pedestal 106. In yet other embodiments, a second fluid connector, orifice or orifices may be located at or near the top portion of sleeve 108 that permits the gas to escape or leak into the pedestal 106.

The sleeve gasket 202 forms a seal between upper base plate 204 and the inner portions of the sleeve 108, such that the purge gas is contained within the sleeve at its junction with the base plate 205. Additionally, the sleeve gasket 202 provides an elastic force that keeps the upper portion of the sleeve 108 abutted against the heater plate 114, as illustrated with respect to FIG. 4. The sleeve gasket 202 may be of any shape or any material known to have elastomeric properties, such as rubber or silicon, so as to provide at least a partial fluid seal and an elastic force to the lower portion of sleeve 108. Among various embodiments, the size and shape of the sleeve gasket 202 may be varied in order to control the flow of the purge gas into the inner portions of sleeve 108 and the degree of seal between the sleeve 108, upper base plate 204, and the pedestal 106.

In one embodiment of the present invention, the pedestal 106 encloses upper base plate 204 and is coupled to the lower base plate 205 at lower flange 212 by fasteners 213. Sandwiched between the lower base plate 204 and the lower flange 212 is pedestal gasket 326. Pedestal gasket 326 provides a seal between the junction of the upper base plate 204, the lower base plate 205 and the bottom surface of pedestal 106, such that fluid may not significantly leak past the lower flange 212 and into the chamber of the reactor. In another embodiment, the seal created by the union of the components and pedestal gasket 326 may be an airtight seal.

Figure 4:
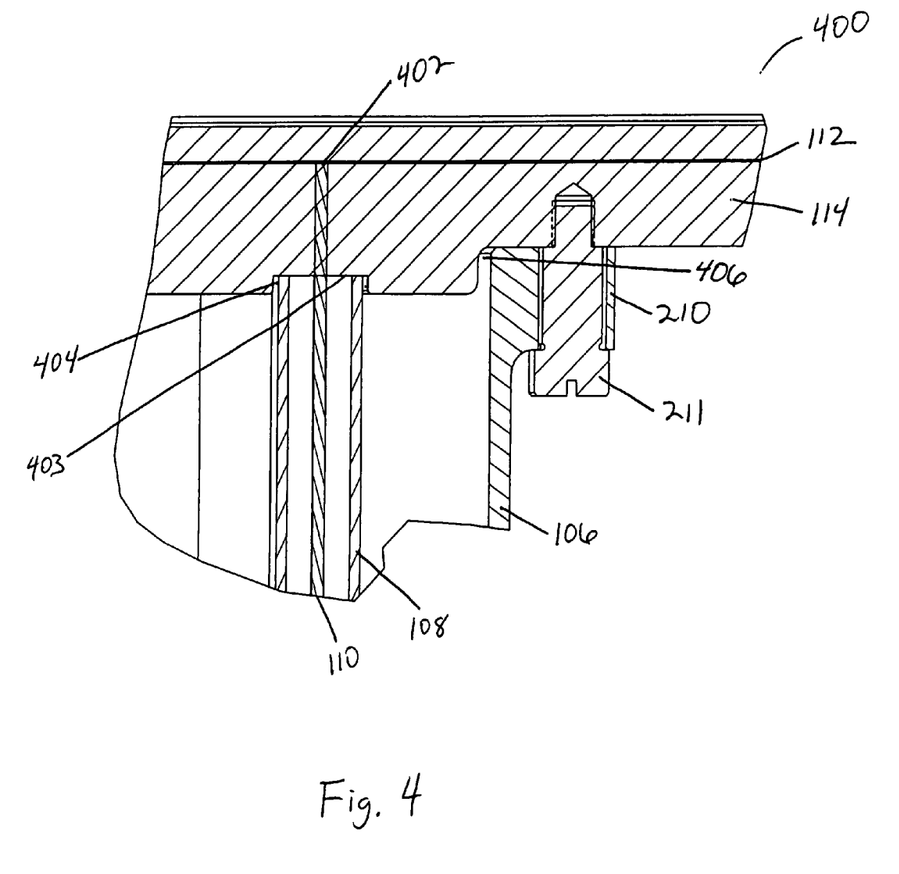
FIG. 4 illustrates a junction between a conductor-containing sleeve and a heater plate within a heater-susceptor assembly configured according to an embodiment of the present invention.

FIG. 4 illustrates an example of a junction 400 between the sleeve 108 and the heater plate 114 within a heater-susceptor assembly configured according to an embodiment of the present invention. For simplicity, sleeves 107 and 109 enclosing heating element conductor 111 and temperature sensor 113, respectively, are not shown, as sleeves 107 and 109 may abut against the heater plate 114 in a fashion similar to sleeve 108.

The heating element conductor 110 is connected to the heater element 112 within heater plate 114. The connection 402 may be countersunk within the heater plate 114 and provides the contact between the heating element conductor 110 the embedded heater element 112. In another embodiment, the connection may be located at the bottom surface of heater plate 114, and the connector 402 makes its connection by direct surface contact against the conductor 110.

As discussed above, the top portion of sleeve 108 is forced to abut against heater plate 114 as a result of the use of elastomeric gaskets at the junction of sleeve 108 and base plate assembly 104. In one embodiment of the present invention, a sleeve receiving area 403 is countersunk into the underside of heater plate 114 so as to provide a channeled recess for the top of the sleeve 108. In another embodiment, the sleeve 108 abuts flush against the underside of heater plate 114.

Regardless of how the sleeve 108 abuts against heater plate 114, the junction is not airtight with respect to the interior of pedestal 106 and therefore does not require any type of gasket or seal. Consequently, during ALD/CVD deposition process, when a purge gas is introduced into the lower end of sleeve 108 it will leak out of the top end thereof and into the interior of pedestal 106.

Thus, in addition to the heating element conductor 110 being physically isolated from the corrosive process gases by pedestal 106 and the sleeve 108, it is also chemically isolated therefrom by the inert purge gas within sleeve 108. The purge gas is further allowed to leak out of pedestal 106 into chamber 105 (below the surface of the wafer) where it is pumped out with the process gas. This positive flow of purge gas prevents, or at least minimizes, process gas flow into the pedestal 106 and sleeve 108 thereby isolating the heating element conductor or other elements and/or electrical connector from the corrosive environment of the reactor chamber.

In one embodiment, the mating surface of the sleeve 108 and the heater plate 114 include at least one orifice 404 for the inert gas to leak into the inner portion of pedestal 106. In other embodiments, the surface of heater plate 114 covered by the upper portion of the sleeve 108 may have channels or veins that allow for the gas to escape or leak into the pedestal 106. In yet other embodiments, a fluid connector and/or orifice or orifices may be located at or near the top portion of sleeve 108 that allow for the gas to escape or leak into the pedestal 106.

As discussed earlier, pedestal 106 is coupled to the heater plate 114 by its upper flange 210 and fasteners 211 and is the first layer of protection for heating element conductor 110 from the highly corrosive and reactive process gases within the chamber 105. Although affixed with fasteners 211, the junction between pedestal 106 and heater plate 114 is not airtight. Rather, the junction is configured to let the purge gas from sleeve 108 leak into the chamber. In one embodiment of the present invention, the pedestal 106 includes at least one orifice 406 that allows for the purge gas to leak into the chamber. The orifice 406 may be embedded into the heater plate 114, which may include channels leading to the exterior of pedestal 106. In another embodiment a fluid connector and/or orifice or orifices may be located on pedestal 106 that allow for the gas to escape or leak into the chamber.

In sum, due to the flow of the inert purge gas through the sleeves 108 and 109, pedestal 106 and into the chamber 105, damage to the heating element conductors 110, 111 and temperature sensor 113 is greatly reduced if not eliminated.

Because high temperature hermetic seals are not required to create an airtight seal for either the pedestal 106 or the sleeves, costs are minimized in both the manufacturing of the reactor and repair associated with the inevitable failure of such seals.

In the foregoing specification, the invention has been described with reference to specific embodiments. It will, however, be evident that various modifications and changes can be made without departing from the broader spirit and scope of the invention as set forth in the appended claims. The specification and drawings are, accordingly, to be regarded in an illustrative rather than a restrictive sense.

What is claimed is:

1. A heater assembly for a wafer processing chamber, comprising:
    an electrically operated heating platform;
    a sleeve having a hollow interior;
    an electrical conductor disposed within the hollow interior of the sleeve and connected to the electrically operated heating platform; and
    a base plate assembly adapted to support the sleeve within the chamber so as to provide a non-airtight junction at a first end of the sleeve where it contacts the electrically operated heating platform.

2. The heater assembly of claim 1, wherein the electrically operated heating platform includes a heater plate that is adapted to support a wafer.

3. The heater assembly of claim 2, wherein the electrically operated heating platform includes a heater element embedded within the heater plate.

4. The heater assembly of claim 3, wherein the heater element is a resistive heating element.

5. The heater assembly of claim 1, wherein the sleeve is ceramic.

6. The heater assembly of claim 5, wherein the sleeve is aluminum oxide.

7. The heater assembly of claim 5, wherein the sleeve is aluminum nitride.

8. The heater assembly of claim 1, wherein the base plate assembly is metallic.

9. The heater assembly of claim 1, further comprising an elastomeric gasket included within the base plate assembly and adapted to provide a seal at a second end of the sleeve where it contacts the base plate assembly.

10. The heater assembly of claim 9, where in the seal at the second end of the sleeve is an airtight seal.

11. The heater assembly of claim 9, wherein the elastomeric gasket is further adapted to provide a spring force at the second end of the sleeve to maintain contact of the first end of the sleeve with the electrically operated heating platform.

12. The heater assembly of claim 1, wherein the base plate assembly includes a coolant manifold adapted for coolant flow therein.

13. The heater assembly of claim 1, further comprising at least one purge gas manifold within the base plate assembly adapted to provide a fluid path to the hollow interior of the sleeve.

14. The heater assembly of claim 13, wherein the base plate assembly comprises a lower base plate coupled to an upper base plate.

15. The heater assembly of claim 14, further comprising an insulator located between the lower base plate and upper base plate and surrounding a portion of the electrical conductor which passes through the insulator within the base plate assembly.

16. The heater assembly of claim 15, further comprising an insulator seal adapted to prevent fluid leakage from a junction between the purge gas manifold, the insulator and the upper base plate.

17. The heater assembly of claim 16, further comprising, a stabilizer countersunk flush with an upper surface of the lower base plate so as to create a mating surface with the insulator which is countersunk flush with a lower surface of the upper base plate, the stabilizer being adapted to support the electrical conductor and to cooperate with a conductor seal surrounding the electrical conductor and located at the mating surface to prevent fluid from the purge gas manifold from leaking along a portion of the electrical conductor which passes through the insulator and the stabilizer.

18. The heater assembly of claim 1, further comprising an atmospheric support tube coupled to the base plate assembly so as to support the heater assembly within the wafer processing chamber.

19. The heater assembly of claim 18, wherein the atmospheric support tube includes cooling ducts therein adapted to carry heat away from the base plate assembly.

20. The heater assembly of claim 1, further comprising a source fitting coupled to the sleeve and adapted to allow fluid to pass into the hollow interior of the sleeve.

21. The heater assembly of claim 1, further comprising a return fitting coupled to the sleeve and adapted to allow fluid to pass out of the hollow interior of the sleeve.

22. The heater assembly of claim 1, wherein the conductor is coiled within the interior of the sleeve.

23. The heater assembly of claim 1, further comprising at least one orifice located at the non-airtight junction at the first end of the sleeve adapted to permit a purge gas to leak from the hollow interior of the sleeve into the wafer processing chamber.

24. A heater assembly for a wafer processing chamber, comprising:
    an electrically operated heating element supported by a pedestal having a hollow interior;
    a sleeve disposed within the hollow interior of the pedestal and itself having a hollow interior;
    an electrical conductor disposed within the hollow interior of the sleeve and connected to the electrically operated heating element; and
    a base plate assembly adapted to support the sleeve within the hollow interior of the pedestal and to provide a manifold for a purge gas to be provided to the hollow interior of the sleeve during wafer processing operations.

25. The heater assembly of claim 24, wherein the base plate assembly is coupled to the pedestal and adapted to provide a seal at a first end of the sleeve and at a first end of the pedestal where each contacts the base plate assembly.

26. The heater assembly of claim 25, wherein the seal at the first end of the sleeve is an airtight seal.

27. The heater assembly of claim 25, further comprising at least one orifice located at a non-airtight junction at a second end of the sleeve adapted to permit the purge gas to leak from the hollow interior of the sleeve into the hollow interior of the pedestal.

28. The heater assembly of claim 27, further comprising a second orifice located at a non-airtight junction at a second end of the pedestal adapted to permit the purge gas to leak from the hollow interior of the pedestal into the wafer processing chamber.

29. A method, comprising:

delivering a purge gas within a sleeve located in a pedestal, the sleeve surrounding an electrical conductor associated with an electrically operated heating assembly of a wafer processing chamber so that the purge gas envelopes the electrical conductor within the sleeve and escapes from an unsealed end thereof into the processing chamber to be pumped out with process gases.

* * * * *